United States Patent
Min et al.

(10) Patent No.: US 7,800,972 B2
(45) Date of Patent: Sep. 21, 2010

(54) METHOD OF OPERATING SEMICONDUCTOR MEMORY DEVICE, SEMICONDUCTOR MEMORY DEVICE AND PORTABLE MEDIA SYSTEM INCLUDING THE SAME

(75) Inventors: Young-sun Min, Seoul (KR); Chang-ho Shin, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 290 days.

(21) Appl. No.: 12/003,561

(22) Filed: Dec. 28, 2007

(65) Prior Publication Data
US 2008/0159049 A1 Jul. 3, 2008

(30) Foreign Application Priority Data
Jan. 2, 2007 (KR) .................. 10-2007-0000273

(51) Int. Cl.
*G11C 7/00* (2006.01)
(52) U.S. Cl. ............. 365/226; 365/227; 365/229; 365/189.05; 365/205
(58) Field of Classification Search .......... 365/226, 365/227, 229, 189.05, 205
See application file for complete search history.

(56) References Cited
U.S. PATENT DOCUMENTS 6,774,712 B2 * 8/2004 Rhee et al. .......... 327/540
7,492,654 B2 * 2/2009 Won et al. .......... 365/205
2003/0210600 A1 * 11/2003 Koo et al. .......... 365/226
2006/0171231 A1 * 8/2006 Song .......... 365/226

FOREIGN PATENT DOCUMENTS

| KR | 10-2003-0009100 | 1/2003 |
|---|---|---|
| KR | 10 2003 0027198 | 4/2003 |
| KR | 1020040007905 A | 1/2004 |
| KR | 1020060012788 A | 2/2006 |
| KR | 1020060087086 A | 8/2006 |

OTHER PUBLICATIONS

Notice of Allowance for corresponding Korean Application No. 10-2007-0000273 dated Jan. 16, 2009.
Korean Office Action dated Jan. 28, 2008.

* cited by examiner

*Primary Examiner*—Son Dinh
(74) *Attorney, Agent, or Firm*—Harness, Dickey & Pierce, P.L.C.

(57) ABSTRACT

A method of operating a semiconductor memory device may include initializing a first internal circuit in response to a first initialization signal based on an internal power voltage. The first initialization signal may be generated if the semiconductor memory device performs a power-up operation. The semiconductor memory device may enter a deep-power-down (DPD) mode without generating the first initialization signal. The first initialization signal may be generated if the semiconductor memory device exits the DPD mode.

20 Claims, 8 Drawing Sheets

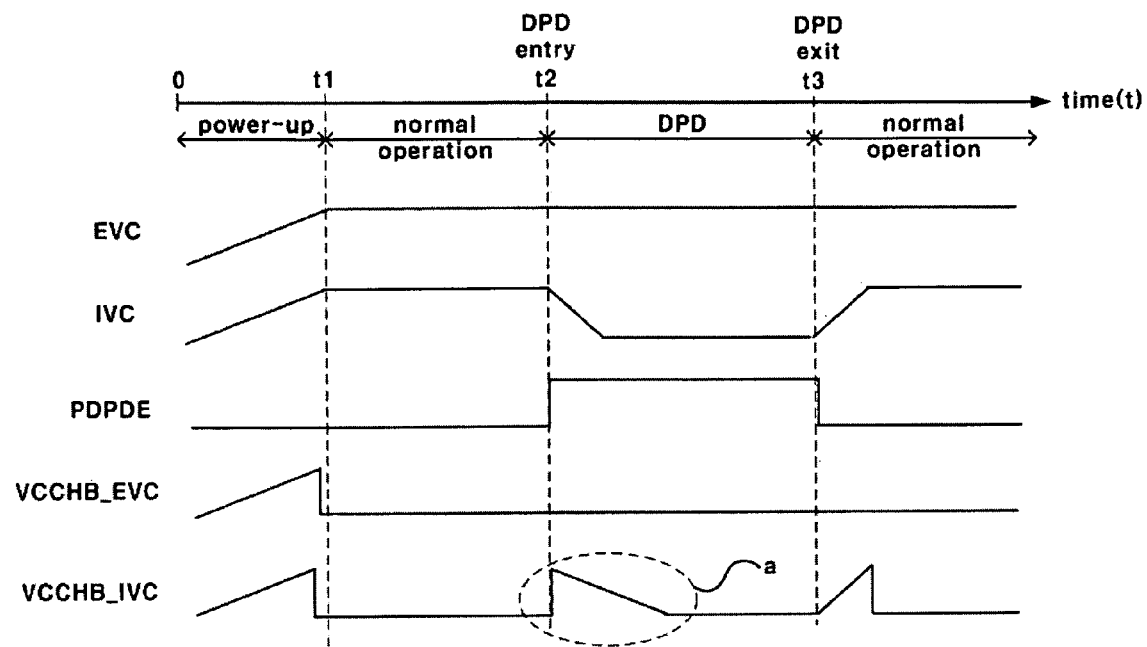
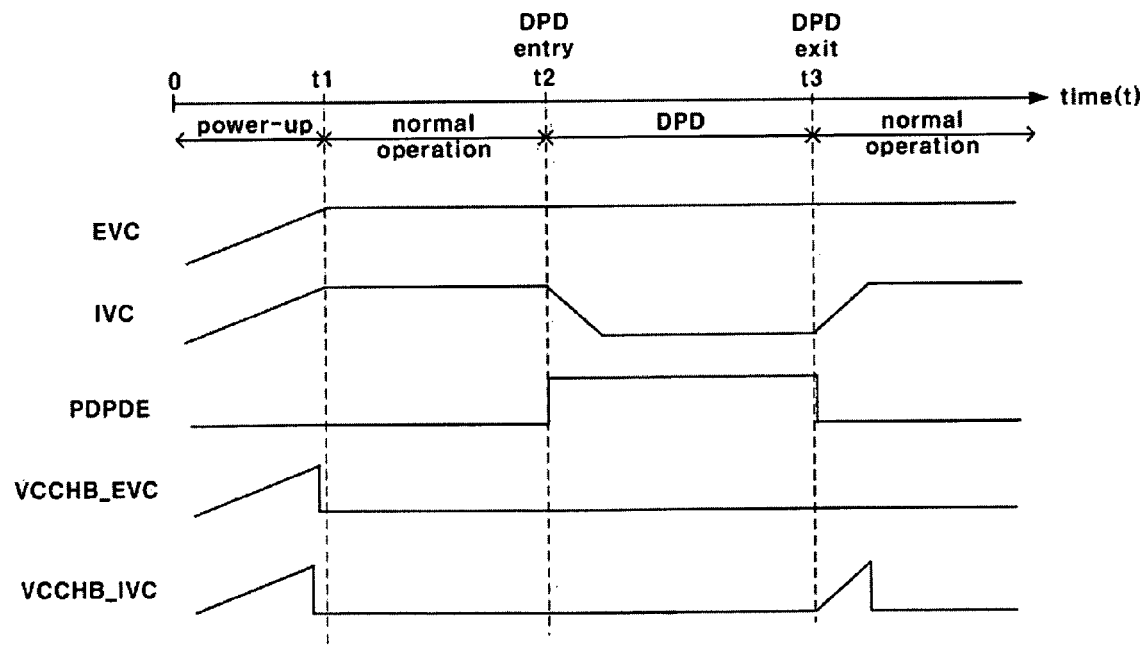

METHOD OF OPERATING SEMICONDUCTOR MEMORY DEVICE, SEMICONDUCTOR MEMORY DEVICE AND PORTABLE MEDIA SYSTEM INCLUDING THE SAME

PRIORITY STATEMENT

This application claims the benefit of priority to Korean Patent Application No. 10-2007-0000273 filed on Jan. 2, 2007 in the Korean Intellectual Property Office, the entire contents of which are incorporated herein in their entirety by reference.

BACKGROUND

1. Field

Example embodiments relate to a method of operating a semiconductor memory device, a semiconductor memory device, and/or a portable media system including the same.

2. Description of Related Art

Internal circuits of a conventional semiconductor memory device are initialized to voltage levels set through initialization in response to an external power voltage EVC applied from an external source. An initialization signal generated from an initializing circuit controls initialization of an internal circuit. The initialization signal generally determines a logic level of a latch circuit incorporated in the internal circuit.

Initialization signals include a first initialization signal and a second initialization signal. As a voltage level of the external power voltage EVC is increased during a power-up operation, a voltage level of the first initialization signal is increased to a desired, or alternatively, a predetermined level. After the first initialization signal reaches the desired, or alternatively, the predetermined level, the voltage level of the first initialization signal is fixed at a low level. As a voltage level of an internal power voltage IVC is increased, a voltage level of the second initialization signal is increased to a desired, or alternatively, a predetermined level. After the second initialization signal reaches the desired, or alternatively, the predetermined level, the voltage level of the second initialization signal is fixed at a low level.

If retaining data in a standby mode is not necessary, a semiconductor memory device, e.g., a dynamic random access memory (DRAM), enters a deep-power-down mode (hereinafter referred to as "DPD mode") in which power consumption is reduced or minimized by interrupting the operation of a circuit for performing self-refresh cycles, or by not operating an internal voltage generator in the memory device.

FIG. 1 is a schematic timing diagram illustrating an operation of a conventional semiconductor memory device.

Referring to FIG. 1, the semiconductor memory device performs a power-up operation for a period of time 0-t1, the semiconductor memory device operates normally for a period of time t1-t2, the semiconductor memory device operates in a DPD mode for a period of time t2-t3, and the semiconductor memory device operates normally again after t3. During the DPD mode, a deep-power-down control signal PDPDE is enabled to a logic high level.

A first initialization signal VCCHB_IVC based on an internal power voltage IVC is generated if the semiconductor memory device performs a power-up operation, if the semiconductor memory device enters the DPD mode, and if the semiconductor memory device exits from the DPD mode.

The first initialization signal VCCHB_IVC (see a portion indicated by reference character "a" in FIG. 1), generated if the semiconductor memory device enters the DPD mode at time t2, may undesirably generate leakage current in the internal circuit.

SUMMARY

According to an example embodiment, a method of operating a semiconductor memory device may include providing a first internal circuit initialized in response to a first initialization signal based on an internal power voltage. The first initialization signal may be generated if the semiconductor memory device performs a power-up operation. The semiconductor memory device may enter a deep-power-down (DPD) mode without generating the first initialization signal. The first initialization signal may be generated if the semiconductor memory device exits the DPD mode.

According to an example embodiment, a semiconductor memory device may include a first initializing circuit and/or a first internal circuit. The first initializing circuit may be configured to generate a first initialization signal based on an internal power voltage if the semiconductor memory device performs a power-up operation, configured to generate the first initialization signal if the semiconductor memory device exits a deep-power-down (DPD) mode, and/or configured to not generate the first initialization signal if the semiconductor memory device enters the DPD mode. The first internal circuit may be configured to be initialized in response to the first initialization signal.

According to an example embodiment, a portable media system may include a controller and/or a plurality of the semiconductor memory device. The controller may be configured to processes data. At least one semiconductor memory device of the plurality of semiconductor memory devices may be configured to receive the data from the controller and store the data.

According to an example embodiment, a semiconductor memory device may include a pre-initialization signal-supply unit, a buffer unit, and/or a discharge unit. The pre-initialization signal-supply unit may be configured to supply a first node with a first pre-initialization signal. The pre-initialization signal-supply unit may be configured to increase a voltage level the first pre-initialization signal to a first level as a voltage level of an internal power voltage increases and/or fix the voltage level of the first pre-initialization signal at a logic low level if the first pre-initialization signal reaches the first level. The buffer unit may be configured to buffer the first pre-initialization signal and/or output the buffered first pre-initialization signal to a second node. The discharge unit may be configured to discharge at least one of the first node and the second node to the logic low level in response to a deep-power-down control signal.

BRIEF DESCRIPTION OF THE DRAWINGS

The above and/or other aspects and advantages will become more apparent and more readily appreciated from the following detailed description of example embodiments taken in conjunction with the accompanying drawings of which:

FIG. 1 is an example schematic timing diagram illustrating an operation of a conventional semiconductor memory device;

FIG. 2 is an example schematic timing diagram illustrating an operation of a semiconductor memory device according to an example embodiment;

DETAILED DESCRIPTION OF EXAMPLE EMBODIMENTS

Figure 3:
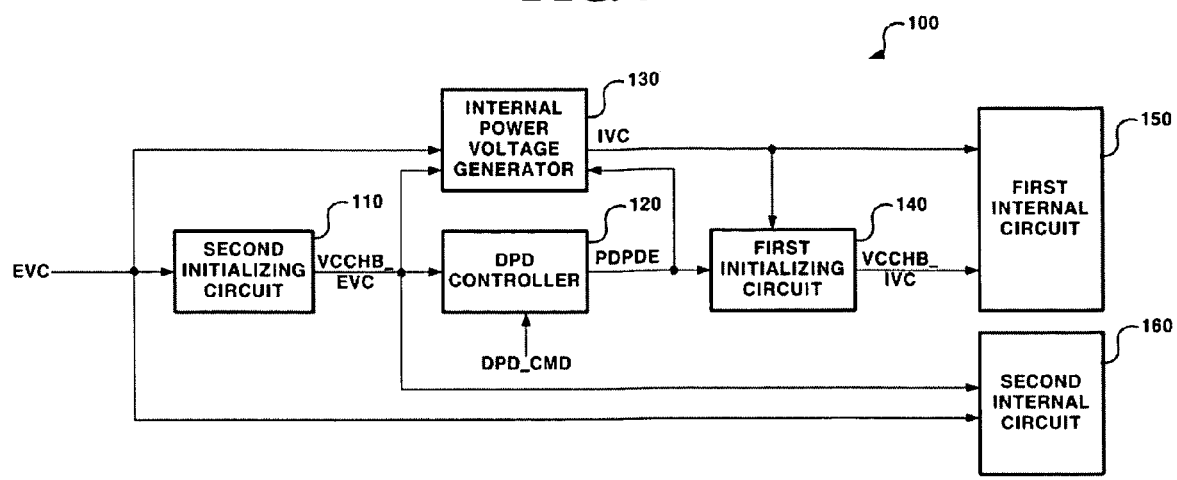
FIG. 3 is a block diagram of a semiconductor memory device according to an example embodiment.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

FIG. 2 is an example schematic timing diagram illustrating an operation of a semiconductor memory device according to an example embodiment.

Referring to FIG. 2, the semiconductor memory device may perform a power-up operation for a period of time 0-t1.

For example, an external power voltage EVC may be applied to the semiconductor memory device and/or a voltage level of the external power voltage EVC may be gradually increased. Accordingly, a voltage level of an internal power voltage IVC based on the external power voltage EVC may be gradually increased.

As the voltage level of the internal power voltage IVC is increased, a first initialization signal VCCHB_IVC based on the internal power voltage IVC may be increased, e.g., increased accordingly, to a desired, or alternatively, a predetermined level, and/or the first initialization signal VCCHB_IVC may be fixed at a logic low level if the first initialization signal VCCHB_IVC reaches the desired, or alternatively, the predetermined level. As the voltage level of the external power voltage EVC is increased, a voltage level of a second initialization signal VCCHB_EVC based on the external power voltage EVC may be increased to a desired, or alternatively, a predetermined level, and the second initialization signal VCCHB_EVC may be fixed at a logic low level if the second initialization signal VCCHB_EVC reaches the desired, or alternatively, the predetermined level.

The first initialization signal VCCHB_IVC based on the internal power voltage IVC may initialize a latch circuit installed in a first internal circuit, and the second initialization signal VCCHB_EVC based on the external power voltage EVC may initialize a latch circuit installed in a second internal circuit. The first internal circuit may be, but is not limited to, a circuit operating based on the internal power voltage IVC, and/or the second internal circuit may be, but is not limited to, a circuit operating based on the external power voltage EVC.

The semiconductor memory device may operate normally for the period of time t1-t2.

For example, the external power voltage EVC may be continuously supplied to the semiconductor memory device and the internal power voltage IVC may be continuously generated from the external power voltage EVC.

During the period of time t1-t2, the first initialization signal VCCHB_IVC based on the internal power voltage IVC and the second initialization signal VCCHB_EVC based on the external power voltage EVC may not be generated.

For the period of time t2-t3, the semiconductor memory device may operate in a deep-power-down (DPD) mode.

For example, at time t2, the deep-power-down control signal PDPDE may be enabled to a logic high level and the semiconductor memory device may operate in a deep-power-down (DPD) mode. The external power voltage EVC may be continuously supplied to the semiconductor memory device, but the internal power voltage IVC may not be generated.

Therefore, the voltage level of the internal power voltage IVC may be lowered. In example embodiments, the first initialization signal VCCHB_IVC based on the internal power voltage IVC may not be generated. Accordingly, unwanted leakage current may be reduced at the first internal circuit, thereby reducing power consumption.

After t3, the semiconductor memory device may return to normal operation.

For example, at time t3, the deep-power-down control signal PDPDE may be deactivated to a logic low level and the semiconductor memory device may exit from the DPD mode. The internal power voltage IVC may be continuously generated from the external power voltage EVC and/or the voltage level of the internal power voltage IVC may be increased. Accordingly, the first initialization signal VCCHB_IVC based on the internal power voltage IVC may be generated, thereby determining the logic level of the latch circuit installed in the first internal circuit.

Accordingly, the first initialization signal VCCHB_IVC based on the internal power voltage IVC may be generated if the semiconductor memory device performs a power-up operation and/or if the semiconductor memory device exits from the DPD mode. However, the first initialization signal VCCHB_IVC based on the internal power voltage IVC may not be generated if the semiconductor memory device enters the DPD mode. The second initialization signal VCCHB_EVC based on the external power voltage EVC may be generated if the semiconductor memory device performs a power-up operation.

FIG. 3 is a block diagram of a semiconductor memory device 100 according to an example embodiment. FIG. 3 may illustrate an example structure for implementing a method of operating the semiconductor memory device shown in FIG. 2, however, a structure and/or method of operating the semiconductor memory device may be modified in various manners by one skilled in the art.

Referring to FIG. 3, the semiconductor memory device 100 may include a second initializing circuit 110, a deep-power-down (DPD) controller 120, an internal power voltage generator 130, a first initializing circuit 140, a first internal circuit 150, and/or a second internal circuit 160.

The second initializing circuit 110 may receive the external power voltage EVC and/or generate the second initialization signal VCCHB_EVC based on the external power voltage EVC if the semiconductor memory device performs a power-up operation. An example of the second initializing circuit 110 will be described below in detail with reference to FIG. 5.

The DPD controller 120 may receive a plurality of control signals DPD_CMD from an external source and/or supply the deep-power-down control signal PDPDE instructing entry into/exit from the DPD mode. The DPD controller 120 may be initialized by receiving the second initialization signal VCCHB_EVC generated by the second initializing circuit 110, however, example embodiments are not limited thereto. The generation process of the deep-power-down control signal PDPDE will be described below in detail with reference to FIG. 4.

The internal power voltage generator 130 may receive the external power voltage EVC and/or generate the internal power voltage IVC on the basis of the external power voltage EVC. The internal power voltage generator 130 may be initialized in response to the second initialization signal VCCHB_EVC based on the external power voltage EVC and/or may be enabled and disabled by the deep-power-down control signal PDPDE. An example of the internal power voltage generator 130 will be described below in detail with reference to FIG. 6.

The first initializing circuit 140 may receive the internal power voltage IVC and/or generate the first initialization signal VCCHB_IVC on the basis of the internal power voltage IVC if the semiconductor memory device performs a power-up operation and/or if the semiconductor memory device exits from the DPD mode. However, if the semiconductor memory device enters the DPD mode, the first initializing circuit 140 may not generate the first initialization signal VCCHB_IVC. For example, for a period of time where the deep-power-down control signal PDPDE is enabled to, for example, a logic high level, the first initializing circuit 140 may not generate the first initialization signal VCCHB_IVC if the semiconductor memory device enters the DPD mode in response to the deep-power-down control signal PDPDE. Examples of the first initializing circuit 140 will be described later in detail with reference to FIGS. 7A and 7B.

The first internal circuit 150 may be initialized in response to the first initialization signal VCCHB_IVC. The first internal circuit 150 may be a circuit operating on the basis of the internal power voltage IVC, however, example embodiments are not limited thereto and the first internal circuit may operate on the basis of another power voltage.

The second internal circuit 160 may be initialized in response to the second initialization signal VCCHB_EVC. The second internal circuit 160 may be a circuit operating on the basis of the external power voltage EVC, however, example embodiments are not limited thereto and the first internal circuit may operate on the basis of another power voltage.

Figure 4:
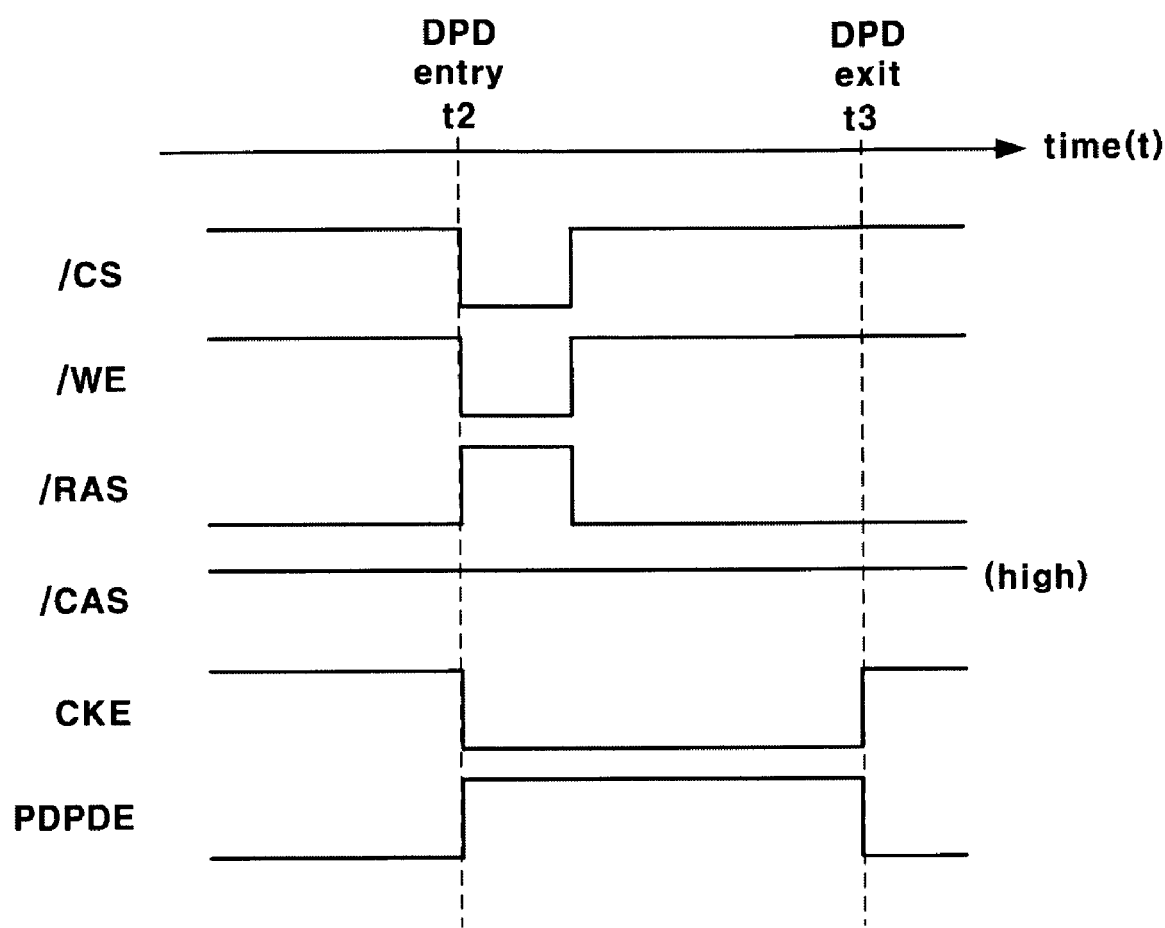
FIG. 4 is an example timing diagram illustrating an operation of the deep power down controller shown in FIG. 3.

FIG. 4 is an example timing diagram illustrating an operation of the deep power down controller 120 shown in FIG. 3.

Referring to FIG. 4, a chip select signal /CS, a write enable signal /WE, a clock enable signal CKE, a row address strobe signal /RAS, and/or a column address strobe signal /CAS may correspond to the plurality of control signals DPD_CMD shown in FIG. 3.

If the chip select signal /CS, the write enable signal /WE, and/or the clock enable signal CKE transition to logic low levels, the row address strobe signal /RAS transitions to a logic high level, and/or the column address strobe signal /CAS is maintained at a logic high level, the deep-power-down control signal PDPDE may be enabled. Accordingly, the semiconductor memory device may enter the DPD mode.

If the clock enable signal CKE transitions to a logic high level regardless of the logic levels of the other signals /CS, /WE, /RAS and /CAS, the deep-power-down control signal PDPDE may be disabled, and/or the semiconductor memory device may exit from the DPD mode.

The example timing diagram of FIG. 4 is provided only for illustrating an example of signaling entry into/exit from the DPD mode and various modifications may be embodied by one skilled in the art. For example, several signals, for example, /WE, /CAS, and so on, may have inverted logic levels to those shown in FIG. 4. Alternatively, the clock enable signal CKE may be replaced by another signal.

Figure 5:
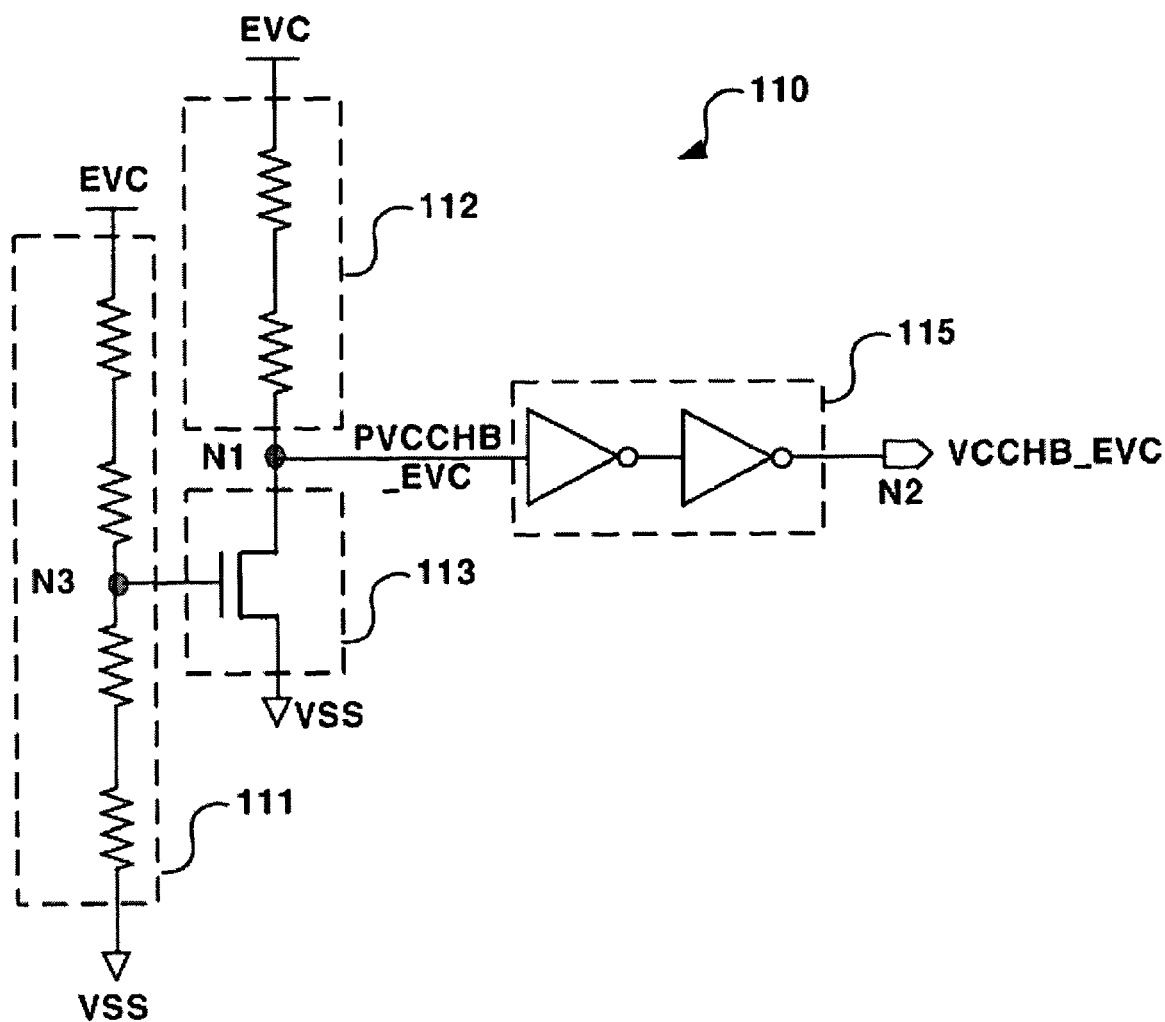
FIG. 5 is an example circuit diagram of the second initializing circuit shown in FIG. 3.

FIG. 5 is an example circuit diagram of the second initializing circuit 110 shown in FIG. 3.

Referring to FIG. 5, the second initializing circuit 110 may include a plurality of pre-initialization signal supply units 111, 112, and/or 113 supplying a second pre-initialization signal PVCCHB-EVC through a first node N1, and/or a buffer 115 buffering the second pre-initialization signal PVCCHB-EVC and/or outputting the buffered pre-initialization signal to a second node N2. As the voltage level of the external power voltage EVC is increased, a voltage level of the second pre-initialization signal PVCCHB-EVC may be increased, e.g., increased accordingly, to a desired, or alternatively, a predetermined level, and/or fixed at a logic low level if the second pre-initialization signal PVCCHB-EVC reaches the desired, or alternatively, the predetermined level. The plurality of pre-initialization signal supply units 111, 112 and 113 may include a first resistor string 111 including a plurality of resistors coupled between a node for the external power voltage EVC and a node for a ground voltage VSS, a second resistor string 112 including at least one resistor coupled between the external power voltage EVC node and the first node N1, and/or an NMOS transistor 113 coupled between the first node N1 and the ground voltage VSS node and having a gate coupled to a third node N3 between at least two of the plurality of resistors included in the first resistor string 111.

The buffer unit 115 may include a plurality of inverters connected in series. The respective inverters may operate based on the external power voltage EVC.

An operation of the second initializing circuit 110 will now be described. Even if the voltage level of the external power voltage EVC is increased during a power-up operation, a gate-source voltage of the NMOS transistor 113 may not exceed a threshold voltage Vt before the voltage level of the external power voltage EVC reaches a desired, or alternatively, a predetermined level. Accordingly, the second pre-initialization signal PVCCHB-EVC may increase according to the voltage level of the external power voltage EVC until the voltage level of the external power voltage EVC reaches a desired, or alternatively, a predetermined level. If the voltage level of the external power voltage EVC exceeds the desired, or alternatively, the predetermined level to turn on the NMOS transistor 113, the voltage level of the second pre-initialization signal PVCCHB-EVC may become a ground voltage level, e.g., a logic low level. Because the second initialization signal VCCHB_EVC may be obtained by buffering the second pre-initialization signal PVCCHB-EVC, the second initialization signal VCCHB_EVC may be increased in response to the increase in the voltage level of the external power voltage EVC until the voltage level of the external power voltage EVC reaches the desired, or alternatively, the predetermined level. If the voltage level of the external power voltage EVC exceeds the desired, or alternatively, the predetermined level, the second initialization signal VCCHB_EVC may transition to the ground voltage level, e.g., logic low.

Figure 6:
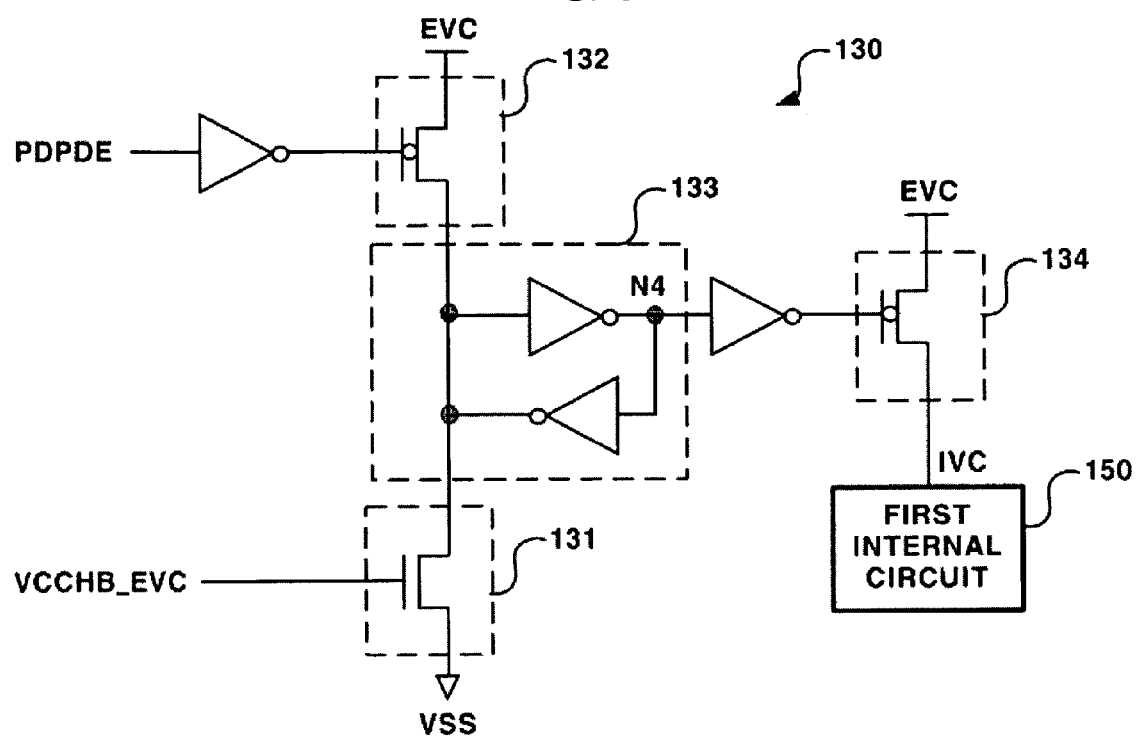
FIG. 6 is an example circuit diagram of the internal power voltage generator shown in FIG. 3.

FIG. 6 is an example circuit diagram of the internal power voltage generator 130 shown in FIG. 3.

Referring to FIG. 6, the internal power voltage generator 130 may include an NMOS transistor 131, a PMOS transistor 132, a latch circuit 133, and/or a PMOS transistor 134. The PMOS transistor 132 may be coupled between the external power voltage EVC and the latch circuit 133, and/or the NMOS transistor 131 may be coupled between the latch circuit 133 and the ground voltage VSS node. A gate of the PMOS transistor 132 may receive the deep-power-down control signal PDPDE inverted by an inverter, and/or a gate of the NMOS transistor 131 may receive the second initialization signal VCCHB_EVC. The latch circuit 133 may include a first inverter coupled between a fourth node N4 and a common node of the PMOS transistor 132 and the NMOS transistor 131 and/or a second inverter coupled between the fourth node N4 and the common node of the PMOS transistor 132 and the NMOS transistor 131. The PMOS transistor 134 may be coupled between the external power voltage EVC and the first internal circuit 150, and/or a gate of the PMOS transistor 134 may receive an output of the latch circuit 133 inverted by another inverter.

An operation of the internal power voltage generator 130 is described below. During a power-up operation, the second initialization signal VCCHB_EVC based on the external power voltage EVC may temporarily transition to a logic high level, and/or the NMOS transistor 131 may be turned on to latch the fourth node N4 to a logic high level. Accordingly, the PMOS transistor 134 may be turned on to generate the internal power voltage IVC and/or activate supply of the generated internal power voltage IVC to the first internal circuit 150.

Because the deep-power-down control signal PDPDE may be enabled to a logic high level if the semiconductor memory device is entering the DPD mode, the PMOS transistor 132 may be turned on to latch the fourth node N4 to a logic low level. Accordingly, the PMOS transistor 134 may be turned off to deactivate supply of the generated internal power voltage IVC to the first internal circuit 150.

Figure 7A:
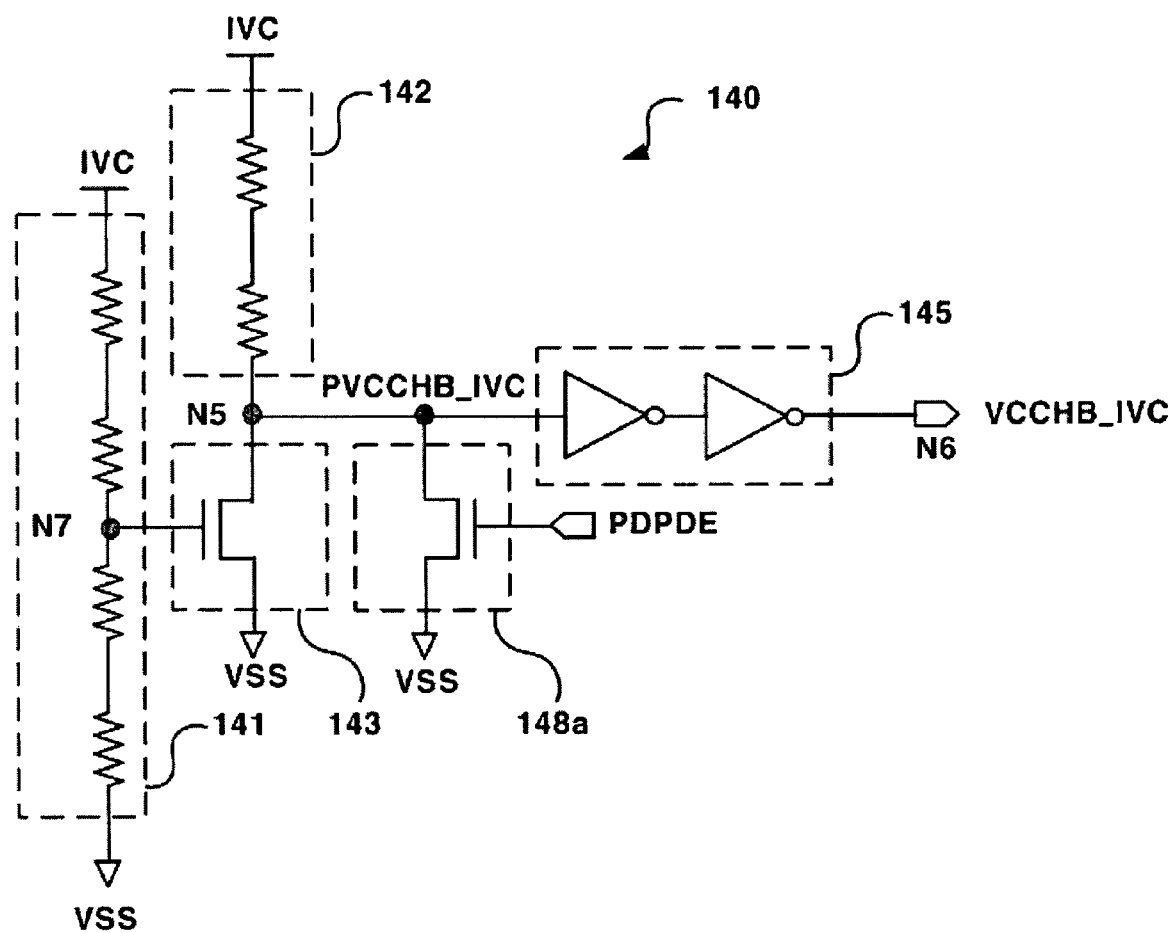
FIG. 7A is an example circuit diagram of the first initializing circuit shown in FIG. 3.

FIG. 7A is an example circuit diagram of the first initializing circuit 140 shown in FIG. 3 according to an example embodiment.

Referring first to FIG. 7A, the first initializing circuit 140 may include a plurality of pre-initialization signal supply units 141, 142, and/or 143, a buffer 145, and/or a discharge unit 148a.

The plurality of pre-initialization signal supply units 141, 142 and 143 may supply a first pre-initialization signal PVCCHB-IVC through a fifth node N5. As the voltage level of the internal power voltage IVC is increased, the voltage level of the first pre-initialization signal PVCCHB-IVC may be increased, e.g., increased accordingly, to a desired, or alternatively, a predetermined level, and/or fixed at a logic low level if the first pre-initialization signal PVCCHB-IVC reaches the desired, or alternatively, the predetermined level. For example, the plurality of pre-initialization signal supply units 141, 142 and 143 may include a first resistor string 141 including a plurality of resistors coupled between a node for the internal power voltage IVC and a node for the ground voltage VSS, a second resistor string 142 including at least one resistor coupled between the internal power voltage IVC node and the fifth node N5, and/or an NMOS transistor 143 coupled between the fifth node N5 and the ground voltage VSS node and having a gate coupled to a seventh node N7 between at least two of the plurality of resistors in the first resistor string 141.

The buffer 145 may buffer the first pre-initialization signal PVCCHB-IVC, and outputs the buffered first pre-initialization signal to a sixth node N6. The buffer 145 may include a plurality of inverters connected in series. The respective inverters may operate based on the internal power voltage IVC.

The discharge unit 148a may discharge the fifth node N5 to a logic low level, e.g., a ground voltage level, in response to the deep-power-down control signal PDPDE. The discharge unit 148a may be an NMOS transistor coupled between the fifth node N5 and the ground voltage VSS node. A gate of the discharge unit 148a may receive the deep-power-down control signal PDPDE.

An operation of the first initializing circuit 140 according to an example embodiment will now be described. Even if the voltage level of the internal power voltage IVC is increased during the power-up operation, a gate-source voltage of the NMOS transistor 143 may not exceed a threshold voltage Vt before the voltage level of the internal power voltage IVC reaches a desired, or alternatively, a predetermined level. Accordingly, the first pre-initialization signal PVCCHB-IVC may increase according to the voltage level of the internal power voltage IVC until the voltage level of the internal power voltage IVC reaches a desired, or alternatively, a predetermined level. If the voltage level of the internal power voltage IVC exceeds the desired, or alternatively, the predetermined level to turn on the NMOS transistor 143, the voltage level of the first pre-initialization signal PVCCHB-IVC may become the ground voltage level, e.g., logic low. Because the first initialization signal VCCHB_IVC is obtained by buffering the first pre-initialization signal PVCCHB-IVC, the first initialization signal VCCHB_IVC may be increased in response to the increase in the voltage level of the internal power voltage IVC until the voltage level of the internal power voltage IVC reaches the desired, or alternatively, the predetermined level. If the voltage level of the internal power voltage IVC exceeds the desired, or alternatively, the predetermined level, the first initialization signal VCCHB_IVC may transition to the ground voltage level, e.g., logic low.

Because the deep-power-down control signal PDPDE may be enabled to a logic high level if the semiconductor memory device enters the DPD mode, the discharge unit 148a may be enabled to discharge the fifth node N5 to a logic low level, e.g., a ground voltage level. Accordingly, the first initialization signal VCCHB_IVC based on the internal power voltage IVC may not be generated.

Figure 7B:
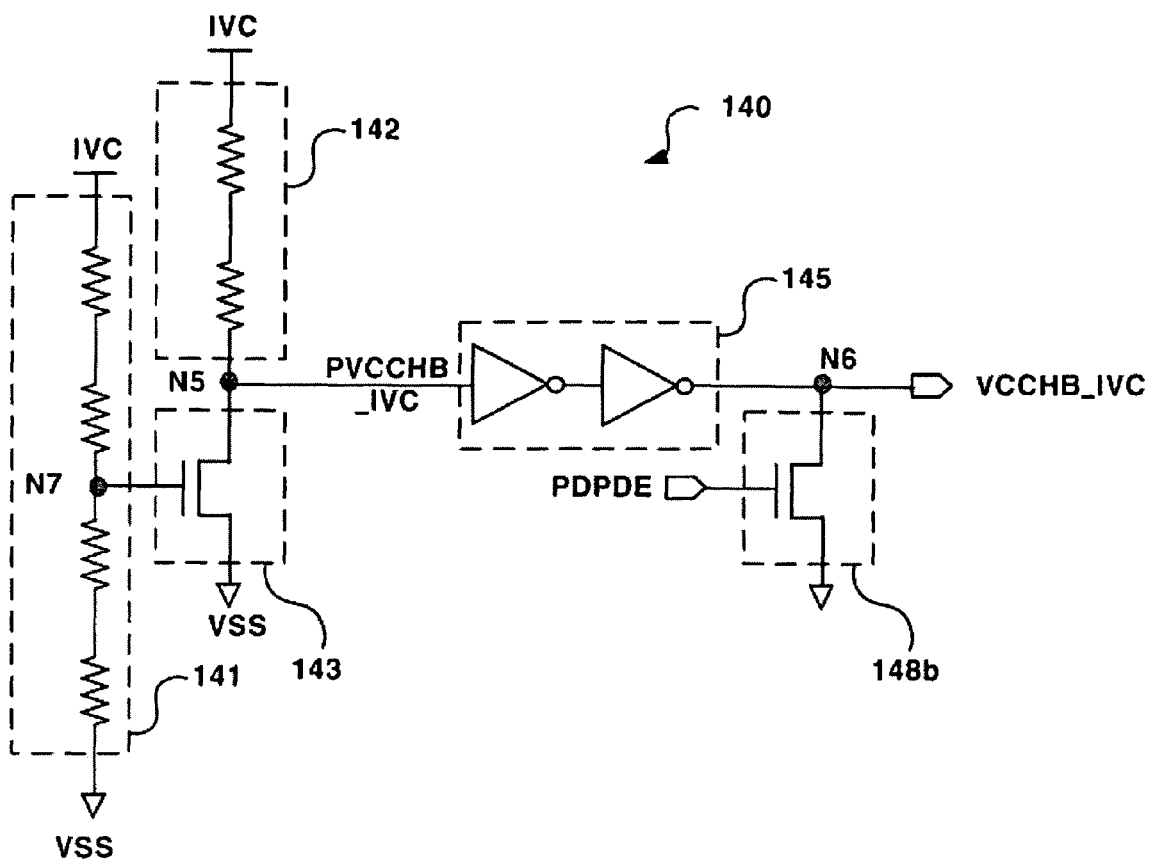
FIG. 7B is another example circuit diagram of the first initializing circuit shown in FIG. 3.

FIG. 7B is another example circuit diagram of the first initializing circuit 140b shown in FIG. 3 according to another example embodiment.

Referring to FIG. 7B, the first initializing circuit 140 as shown in FIG. 7b is substantially the same as the first initializing circuit 140 shown in FIG. 7A, except that a discharge unit 148b may be coupled between the sixth node N6 and the ground voltage VSS node. Because the deep-power-down control signal PDPDE may be enabled to a logic high level if the semiconductor memory device is entering the DPD mode, the discharge unit 148b may be enabled to discharge the sixth node N6 to a logic low level, e.g., a ground voltage. Accordingly, the first initialization signal VCCHB_IVC based on the internal power voltage IVC may not be generated.

Figure 8:
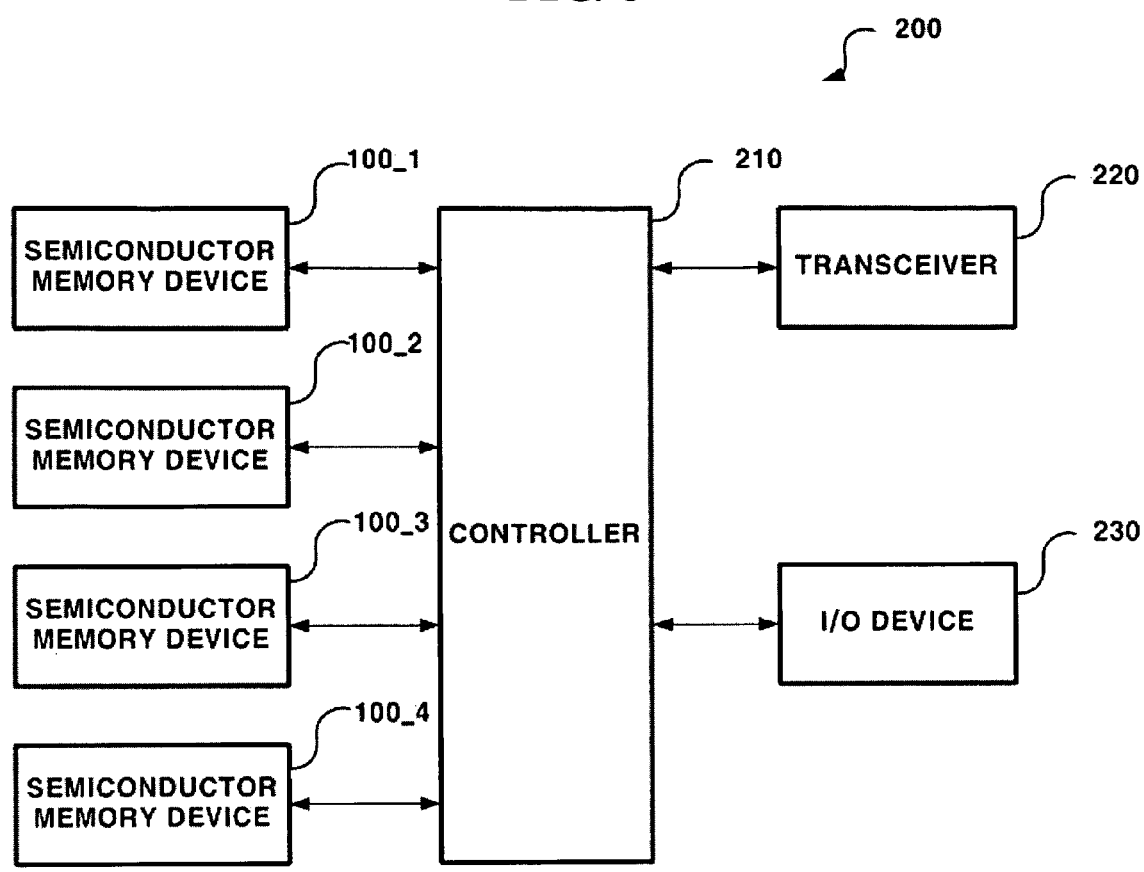
FIG. 8 is a schematic block diagram of a portable media system including a semiconductor memory device according to an example embodiment.

FIG. 8 is a schematic block diagram of a portable media system including a semiconductor memory device according to an example embodiment. In an example embodiment, the portable media system is described by way of example of a mobile phone, however, example embodiments are not limited thereto. Rather, example embodiments may also be applied to a two-way communications system, a one-way pager, a two-way pager, a personal communications system, a portable computer, a personal data assistant (PDA), an MPEG audio layer-3 (MP3) player, a digital camera, and/or other electronic devices.

Referring to FIG. 8, the portable media system 200 may include a controller 210, a transceiver 220, an I/O device 230, and/or a plurality of semiconductor memory devices 100_1, 100_2, 100_3, and 100_4.

The controller 210 may be, for example, microprocessors, digital signal processors, microcontrollers and/or the like.

The plurality of semiconductor memory devices 100_1, 100_2, 100_3, and 100_4 may store messages transmitted to the portable media system 200 or an external device. For example, the plurality of semiconductor memory devices 100_1, 100_2, 100_3, and 100_4 may store data or instructions executed by the controller while the portable media system 200 is operating. The plurality of semiconductor memory devices 100_1, 100_2, 100_3, and 100_4 may be one or more different kinds of semiconductor memory devices. For example, the plurality of semiconductor memory devices 100_1, 100_2, 100_3, and 100_4 may be volatile memory devices, e.g., DRAM, or nonvolatile memory devices, e.g., flash memory devices and/or phase-change memory devices. Volatile memory devices may be the semiconductor memory device according to an example embodiment described below.

For example, a challenging task of the portable media system 200 is may be to reduce power consumption. As described above, leakage current that may occur at the time of entry into the DPD mode may be reduced by using a plurality of semiconductor memory devices 100_1, 100_2, 100_3, and 100_4 according to example embodiments, thereby reducing power consumption.

The I/O device 230 may generate a message in response to user manipulation. The I/O device 230 may comprise a keypad, a monitor, and/or the like.

The portable media system 200 may transmit or receive messages in a wireless manner through the transceiver 220 connected to an antenna (not shown). The portable media system 200 may transmit or receive messages using protocols, e.g., CDMA (Code Division Multiple Access), GSM (Global System for Mobile communication), NADC (North American Digital Cellular), TDMA (Time Division Multiple Access), ETDMA (Extended TDMA), third-generation WCDMA (Wideband CDMA), and/or CDMA-2000.

As described above, according to example embodiments, leakage current generated if a semiconductor memory device enters a DPD mode may be minimized.

Although example embodiments have been shown and described in this specification and figures, it would be appreciated by those skilled in the art that changes may be made to the illustrated and/or described example embodiments without departing from their principles and spirit.

What is claimed is:

1. A method of operating a semiconductor memory device, the method comprising:
   providing a first internal circuit initialized in response to a first initialization signal based on an internal power voltage;
   generating the first initialization signal if the semiconductor memory device performs a power-up operation;
   entering a deep-power-down (DPD) mode without generating the first initialization signal;
   generating the first initialization signal if the semiconductor memory device exits the DPD mode.

2. The method of claim 1, further comprising:
   providing a second internal circuit initialized in response to a second initialization signal based on an external power voltage; and
   generating the second initialization signal if the semiconductor memory device performs the power-up operation.

3. The method of claim 2, wherein the first internal circuit operates based on the internal power voltage and the second internal circuit operates based on the external power voltage.

4. A semiconductor memory device comprising:
   a first initializing circuit configured to generate a first initialization signal based on an internal power voltage if the semiconductor memory device performs a power-up operation, configured to generate the first initialization signal if the semiconductor memory device exits a deep-power-down (DPD) mode, and configured to not generate the first initialization signal if the semiconductor memory device enters the DPD mode; and
   a first internal circuit configured to be initialized in response to the first initialization signal.

5. The semiconductor memory device of claim 4, further comprising:
   a second initializing circuit configured to generate a second initialization signal based on an external power voltage if the semiconductor memory device performs the power-up operation.

6. The semiconductor memory device of claim 5, further comprising:
a second internal circuit configured to be initialized in response to the second initialization signal.

7. The semiconductor memory device of claim 6, wherein the first internal circuit operates based on the internal power voltage, and
the second internal circuit operates based on the external power voltage.

8. The semiconductor memory device of claim 4, further comprising:
a deep-power-down (DPD) controller configured to supply a deep-power-down control signal for instructing entry into/exit from the DPD mode; and
an internal power voltage generator configured to receive an external power voltage and generate an internal power voltage based on the external power voltage,
wherein the first initializing circuit is configured to receive the deep-power-down control signal and the internal power voltage and generate the first initialization signal.

9. The semiconductor memory device of claim 8, wherein the first initializing circuit comprises:
a pre-initialization signal-supply unit configured to supply a first node with a first pre-initialization signal, the pre-initialization signal-supply unit configured to increase a voltage level of the first pre-initialization signal to a first level as a voltage level of the internal power voltage increases and fix the voltage level of the first pre-initialization signal at a logic low level if the first pre-initialization signal reaches the first level;
a buffer unit configured to buffer the first pre-initialization signal and output the buffered first pre-initialization signal to a second node; and
a discharge unit configured to discharge at least one of the first node and the second node to the logic low level in response to the deep-power-down control signal.

10. The semiconductor memory device of claim 9, wherein the pre-initialization signal-supply unit comprises:
a first resistor string including a plurality of resistors coupled between a node for the internal power voltage and a node for a ground voltage;
a second resistor string including at least one resistor coupled between the node for the internal power voltage and the first node; and
an NMOS transistor coupled between the first node and the node for the ground voltage, the NMOS transistor including a gate coupled to a third node between at least two resistors of the plurality of resistors in the first resistor string.

11. The semiconductor memory device of claim 9, wherein the discharge unit comprises an NMOS transistor coupled between the first node and the node for the ground voltage, the NMOS transistor including a gate configured to receive the deep-power-down control signal.

12. The semiconductor memory device of claim 9, wherein the discharge unit comprises an NMOS transistor coupled between the second node and the node for the ground voltage, the NMOS transistor including a gate configured to receive the deep-power-down control signal.

13. A portable media system comprising:
a controller configured to processes data; and
a plurality of the semiconductor memory device of claim 4, wherein at least one semiconductor memory device of the plurality of semiconductor memory devices is configured to receive the data from the controller and store the data.

14. The portable media system of claim 13, wherein if the controller is configured to use only a portion of the plurality of semiconductor memory devices, the remainder of the plurality of semiconductor memory devices are configured to enter the DPD mode if unused by the controller.

15. The portable media system of claim 13, wherein the at least one semiconductor memory device of the plurality of semiconductor memory devices comprises a second initializing circuit configured to generate a second initialization signal based on an external power voltage if the semiconductor memory device performs the power-up operation.

16. The portable media system of claim 15, wherein the at least one semiconductor memory device of the plurality of semiconductor memory devices comprises a second internal circuit configured to be initialized in response to the second initialization signal.

17. A semiconductor memory device comprising:
a pre-initialization signal-supply unit configured to supply a first node with a first pre-initialization signal, the pre-initialization signal-supply unit configured to increase a voltage level of the first pre-initialization signal to a first level as a voltage level of an internal power voltage increases and fix the voltage level of the first pre-initialization signal at a logic low level if the first pre-initialization signal reaches the first level;
a buffer unit configured to buffer the first pre-initialization signal and output the buffered first pre-initialization signal to a second node; and
a discharge unit configured to discharge at least one of the first node and the second node to the logic low level in response to a deep-power-down control signal.

18. The semiconductor memory device of claim 17, wherein the pre-initialization signal-supply unit comprises:
a first resistor string including a plurality of resistors coupled between a node for the internal power voltage and a node for a ground voltage node;
a second resistor string including at least one resistor coupled between the node for the internal power voltage and the first node; and
an NMOS transistor coupled between the first node and the node for the ground voltage, the NMOS transistor including a gate coupled to a third node between at least two resistors of the plurality of resistors in the first resistor string.

19. The semiconductor memory device of claim 17, wherein the discharge unit comprises an NMOS transistor coupled between the first node and the node for the ground voltage, the NMOS transistor including a gate configured to receive the deep-power-down control signal.

20. The semiconductor memory device of claim 17, wherein the discharge unit comprises an NMOS transistor coupled between the second node and the node for the ground voltage, the NMOS transistor including a gate configured to receive the deep-power-down control signal.

* * * * *